(12) United States Patent
Hokari et al.

(10) Patent No.: US 10,546,888 B2
(45) Date of Patent: Jan. 28, 2020

(54) SOLID-STATE IMAGING DEVICE PACKAGE AND MANUFACTURING METHOD, AND ELECTRONIC APPARATUS

(71) Applicant: SONY CORPORATION, Tokyo (JP)

(72) Inventors: Sumio Hokari, Kanagawa (JP); Keiki Fukuda, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/763,252

(22) PCT Filed: Sep. 27, 2016

(86) PCT No.: PCT/JP2016/078349
§ 371 (c)(1),
(2) Date: Mar. 26, 2018

(87) PCT Pub. No.: WO2017/061296
PCT Pub. Date: Apr. 13, 2017

(65) Prior Publication Data
US 2018/0286902 A1 Oct. 4, 2018

(30) Foreign Application Priority Data
Oct. 9, 2015 (JP) .................................. 2015-200666

(51) Int. Cl.
*H01L 31/0232* (2014.01)
*H01L 27/146* (2006.01)
(Continued)

(52) U.S. Cl.
CPC ...... *H01L 27/14618* (2013.01); *H01L 23/562* (2013.01); *H04N 5/3572* (2013.01)

(58) Field of Classification Search
CPC .............................................. H01L 27/14618
(Continued)

(56) References Cited

U.S. PATENT DOCUMENTS

| | | | | |
|---|---|---|---|---|
| 2006/0278820 | A1* | 12/2006 | Senba | H01L 23/057 250/239 |
| 2009/0079019 | A1* | 3/2009 | Funao | H01L 27/14621 257/432 |
| 2012/0211852 | A1 | 8/2012 | Iwafuchi et al. | |

FOREIGN PATENT DOCUMENTS

| | | |
|---|---|---|
| JP | 04-337668 A | 11/1992 |
| JP | 10-209314 A | 8/1998 |

(Continued)

OTHER PUBLICATIONS

International Search Report and Written Opinion of PCT Application No. PCT/JP2016/078349, dated Dec. 27, 2016, 08 pages of English Translation and 07 pages of ISRWO.

(Continued)

*Primary Examiner* — Ajay Arora
(74) *Attorney, Agent, or Firm* — Chip Law Group

(57) ABSTRACT

The present disclosure relates to a solid-state imaging device package that enables capturing of higher-quality images, a method of manufacturing the solid-state imaging device package, and an electronic apparatus. The solid-state imaging device package includes: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto the light receiving surface of the solid-state imaging device chip; and a protective glass that protects at least the solid-state imaging device chip from external environments, and transmits light. A raised bank structure is formed on the adhesion surface of the frame in contact with the protective glass, and is formed along the entire circumference of the opening portion of the frame. The present technology can be applied to a solid-state (Continued)

imaging device package that encloses an imaging device chip, for example.

4 Claims, 8 Drawing Sheets

(51) Int. Cl.
*H01L 23/00* (2006.01)
*H04N 5/357* (2011.01)
(58) Field of Classification Search
USPC .......................................................... 257/432
See application file for complete search history.

(56) References Cited

FOREIGN PATENT DOCUMENTS

| | | |
|---|---|---|
| JP | 2004-349463 A | 12/2004 |
| JP | 2006-066740 A | 3/2006 |
| JP | 2008-245244 A | 10/2008 |
| JP | 2008-300574 A | 12/2008 |
| JP | 2010-192627 A | 9/2010 |
| JP | 2012-186434 A | 9/2012 |
| JP | 2014-103170 A | 6/2014 |

OTHER PUBLICATIONS

International Preliminary Report on Patentability of PCT Application No. PCT/JP2016/078349, dated Apr. 19, 2018, 08 pages of English Translation and 04 pages of IPRP.

\* cited by examiner

SOLID-STATE IMAGING DEVICE PACKAGE AND MANUFACTURING METHOD, AND ELECTRONIC APPARATUS

CROSS REFERENCE TO RELATED APPLICATIONS

This application is a U.S. National Phase of International Patent Application No. PCT/JP2016/078349 filed on Sep. 27, 2016, which claims priority benefit of Japanese Patent Application No. JP 2015-200666 filed in the Japan Patent Office on Oct. 9, 2015. Each of the above-referenced applications is hereby incorporated herein by reference in its entirety.

TECHNICAL FIELD

The present disclosure relates to a solid-state imaging device package and a manufacturing method, and an electronic apparatus. More particularly, the present disclosure relates to a solid-state imaging device package and a manufacturing method, and an electronic apparatus that are designed to capture higher-quality images.

BACKGROUND ART

In a conventional electronic apparatus having an imaging function, such as a digital still camera or a digital video camera, a solid-state imaging device like a charge coupled device (CCD) or a complementary metal oxide semiconductor (CMOS) image sensor is used.

Such a solid-state imaging device is widely used in digital cameras, video cameras, mobile phones, and the like as electronic apparatuses into which a solid-state imaging device package housed in ceramics or the like is incorporated. In addition, in recent years, such electronic apparatuses have become remarkably small in size and capable of high quality imaging. In this trend, a solid-state imaging device package as an important component of such an electronic apparatus is required to be small in size and capture higher-quality images.

For example, the applicant of the present application has suggested an imaging device package in which a space housing an imaging device chip is sealed with a substrate, a support, and an optical member (see Patent Document 1, for example).

CITATION LIST

Patent Document

Patent Document 1: Japanese Patent Application Laid-Open No. 2008-245244

SUMMARY OF THE INVENTION

Problems to be Solved by the Invention

In the above mentioned imaging device package disclosed in Patent Document 1, however, there is a possibility that image quality might deteriorate due to irregular reflection caused by the adhesive that bonds the support and the optical member to each other.

The present disclosure is made in view of those circumstances, and is to enable capturing of higher-quality images.

Solutions to Problems

A solid-state imaging device package according to one aspect of the present disclosure includes: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto the light receiving surface of the solid-state imaging device chip; and a protective glass that protects at least the solid-state imaging device chip from external environments, and transmits light. In the solid-state imaging device package, a raised bank structure is formed on the adhesion surface of the frame in contact with the protective glass, and is formed along the entire circumference of an opening portion of the frame.

A manufacturing method according to one aspect of the present disclosure is a method of manufacturing a solid-state imaging device package including: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto the light receiving surface of the solid-state imaging device chip; a protective glass that protects at least the solid-state imaging device chip from external environments, and transmits light; and a raised bank structure that is formed on the adhesion surface of the frame in contact with the protective glass, the raised bank structure being formed along the entire circumference of the opening portion of the frame. The manufacturing method includes the step of applying an adhesive in such a manner that the adhesive enters a gap formed between the protective glass and the frame by the bank structure.

An electronic apparatus according to one aspect of the present disclosure includes: a solid-state imaging device package according to one aspect of the present disclosure including: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto the light receiving surface of the solid-state imaging device chip; and a protective glass that protects at least the solid-state imaging device chip from external environments, and transmits light. In the solid-state imaging device package, a raised bank structure is formed on the adhesion surface of the frame in contact with the protective glass, and is formed along the entire circumference of an opening portion of the frame.

One aspect of the present disclosure includes: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto the light receiving surface of the solid-state imaging device chip; and a protective glass that protects at least the solid-state imaging device chip from external environments, and transmits light. A raised bank structure is formed on the adhesion surface of the frame in contact with the protective glass, and is formed along the entire circumference of an opening portion of the frame.

Effects of the Invention

According to one aspect of the present disclosure, higher-quality images can be captured.

MODE FOR CARRYING OUT THE INVENTION

The following is a detailed description of a specific embodiment to which the present technology is applied, with reference to the drawings.

<Example Configuration of a Solid-State Imaging Device Package>

Figure 1A:
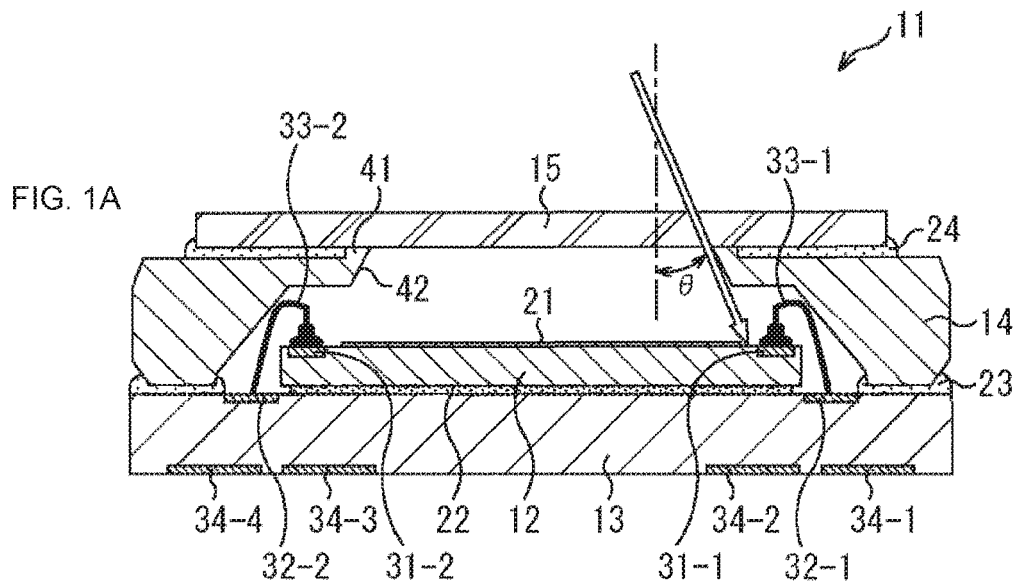
FIGS. 1A and 1B are block diagrams showing an example configuration of an embodiment of a solid-state imaging device package to which the present technology is applied.
Figure 1B:
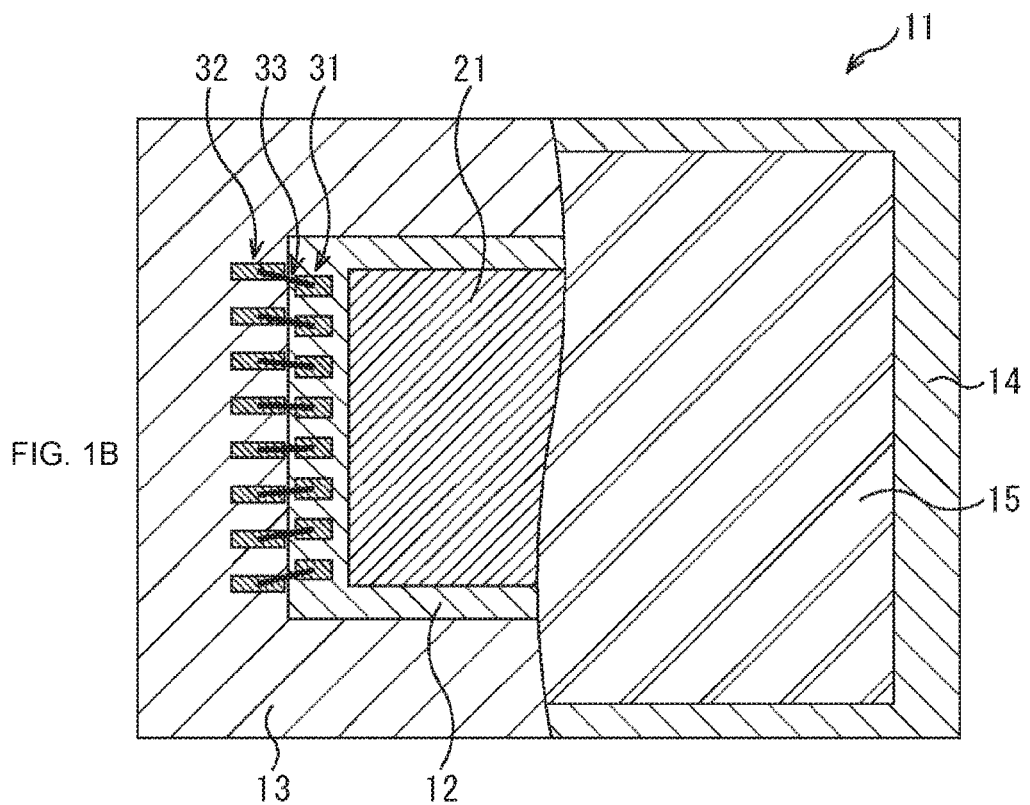

FIGS. 1A and 1B are diagrams showing an example configuration of an embodiment of a solid-state imaging device package to which the present technology is applied. FIG. 1A is a cross-sectional view of the example configuration of a solid-state imaging device package. FIG. 1B is a plan view of the example configuration of a solid-state imaging device package.

As shown in FIGS. 1A and 1B, the solid-state imaging device package 11 has an imaging device chip 12 sealed with an interposer substrate 13, a frame 14, and a protective glass 15.

The imaging device chip 12 is secured to the interposer substrate 13 with an imaging device adhesive 22. The imaging device light receiving surface 21 on which a plurality of pixels are disposed is the upper surface. In addition, imaging device electrodes 31-1 and 31-2 of the imaging device chip 12 and internal electrodes 32-1 and 32-2 of the interposer substrate 13 are electrically connected by connection wires 33-1 and 33-2. The internal electrodes 32-1 and 32-2 are also electrically connected to external connection terminals 34-1 through 34-4 via internal wiring lines of the interposer substrate 13.

The frame 14, which is a frame-shaped structure surrounding the imaging device chip 12, is bonded onto the interposer substrate 13 with a frame adhesive 23. The protective glass 15 is further secured onto the upper surface of the frame 14 with a protective glass adhesive 24. With this arrangement, it is possible to protect the imaging device chip 12, the connection wires 33-1 and 33-2, and the internal electrodes 32-1 and 32-2 from the external environments such as water, gas, and mechanical external force.

It should be noted that an adhesive is normally of an ultraviolet (UV) curing type, a thermal curing type, or an UV/thermal curing type, but the frame adhesive 23 and the protective glass adhesive 24 are normally formed with an UV curing, transparent material, to increase productivity.

In the solid-state imaging device package 11 having such a structure, the light indicated by an outlined arrow passes through the protective glass 15, and is received by the imaging device light receiving surface 21 formed on the imaging device chip 12. The light is then photoelectrically converted into an electrical signal in the imaging device chip 12, and is transferred to the outside from the external connection terminals 34-1 through 34-4 via the imaging device electrodes 31-1 and 31-2, the connection wires 33-1 and 33-2, and the internal electrodes 32-1 and 32-2 of the interposer substrate 13.

Here, the opening portion of the frame 14 is formed so that the maximum incident angle of light taken in through the lens of a digital camera or the like is located on the inner side of the imaging device electrodes 31-1 and 31-2. Because of this, the light can be prevented from being reflected by the imaging device electrodes 31-1 and 31-2, the connection wires 33-1 and 33-2, and the like, and being received by the imaging device light receiving surface 21. Thus, in the solid-state imaging device package 11, imaging quality deterioration such as flare can be prevented.

Meanwhile, in the above mentioned solid-state imaging device package disclosed in Patent Document 1, the protective glass adhesive 24 sometimes spreads to the opening portion of the frame 14, and irregular reflection is caused by the protective glass adhesive 24 in some cases.

Figure 2:
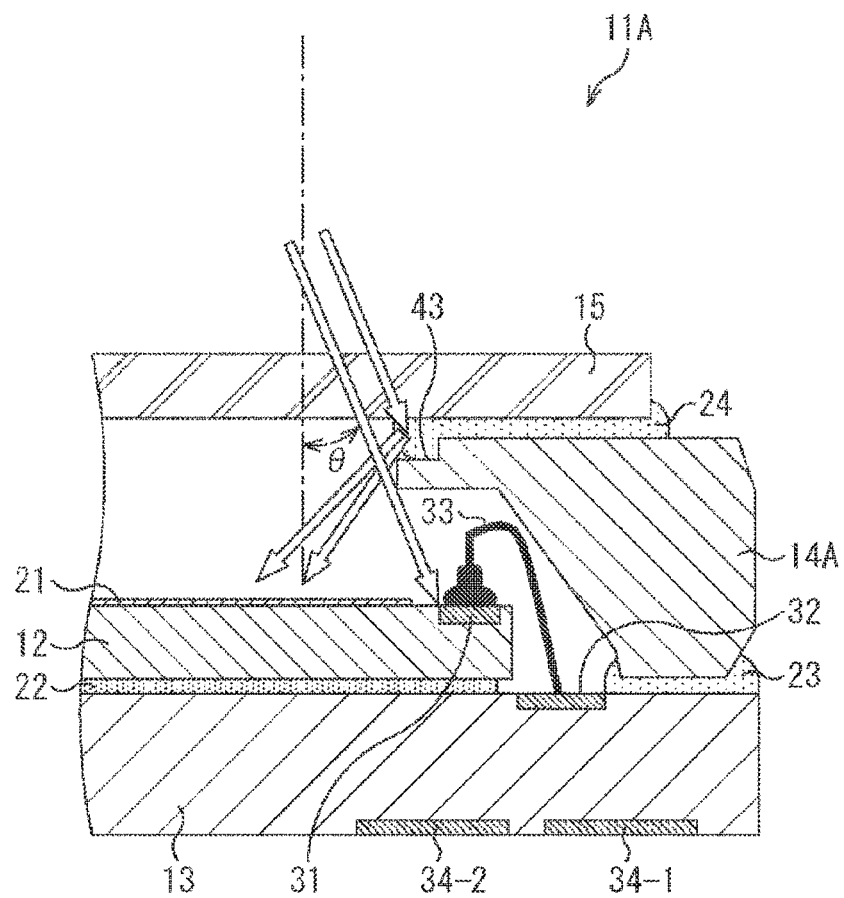
FIG. 2 is a diagram for explaining a conventional solid-state imaging device package.

Referring now to a conventional solid-state imaging device package 11A shown in FIG. 2, imaging quality deterioration is described. It should be noted that, in the solid-state imaging device package 11A shown in FIG. 2, the same configurations as those of the solid-state imaging device package 11 in FIGS. 1A and 1B are denoted by the same reference numerals as those used in FIGS. 1A and 1B, and detailed explanation thereof is not repeated herein.

As shown in FIG. 2, in the conventional solid-state imaging device package 11A, a frame step 43 is provided at the open end of the upper surface of a frame 14A, to accumulate excess adhesive. However, irregular reflection indicated by outlined arrows in FIG. 2 is caused by the adhesive accumulated on the frame step 43, and the reflected light reaches the imaging device light receiving surface 21. In the structure like the conventional solid-state imaging device package 11A, such irregular reflection cannot be prevented, and conspicuous imaging quality deterioration, such as flare, is caused.

Particularly, there has recently been a demand for reductions in size and cost of the solid-state imaging device package 11, and accordingly, there is an increasing demand for a reduction in size of the frame 14, and reductions in size and cost of the protective glass 15. Although the adhesion area is also required to be minimized, it is difficult to control stray adhesive by conventional techniques, and it is necessary to widen the adhesion area. For this reason, the size and the cost of the solid-state imaging device package 11 cannot be reduced.

Therefore, in the solid-state imaging device package 11 shown in FIGS. 1A and 1B, a bank structure 41 that is raised upward is formed along the entire circumference of the open end on the upper surface of the frame 14. With this arrangement, it is possible to prevent the protective glass adhesive 24 from entering the opening portion of the frame 14 when the protective glass 15 is bonded to the frame 14. Thus, the solid-state imaging device package 11 can prevent the protective glass adhesive 24 from causing irregular reflection as described above, prevent ghosts and flare, and provide stable high imaging quality.

Furthermore, in the solid-state imaging device package 11, the application area of the protective glass adhesive 24 can be reduced to the necessary minimum. Thus, it becomes possible to downsize the exteriors of the protective glass 15 and the frame 14, and the size and the cost of the solid-state imaging device package 11 can be reduced.

In addition, the inward-facing surface of the opening portion of the frame 14 is formed with a tapered surface 42 that extends from the top to the bottom at a predetermined angle. As the tapered surface 42 is provided, the adhesion surface with the protective glass adhesive 24 can be maximized while the package size is being reduced, and the protective glass 15 can be bonded to the frame 14 without fail.

<Method for Manufacturing the Solid-State Imaging Device Package>

Referring now to FIGS. 3 through 6, a method of manufacturing the solid-state imaging device package 11 is described. While an adhesive is normally of an UV curing type, a thermal curing type, or an UV/thermal curing type as described above, a manufacturing method using an UV curing type as a typical adhesive is described herein.

Figure 3:
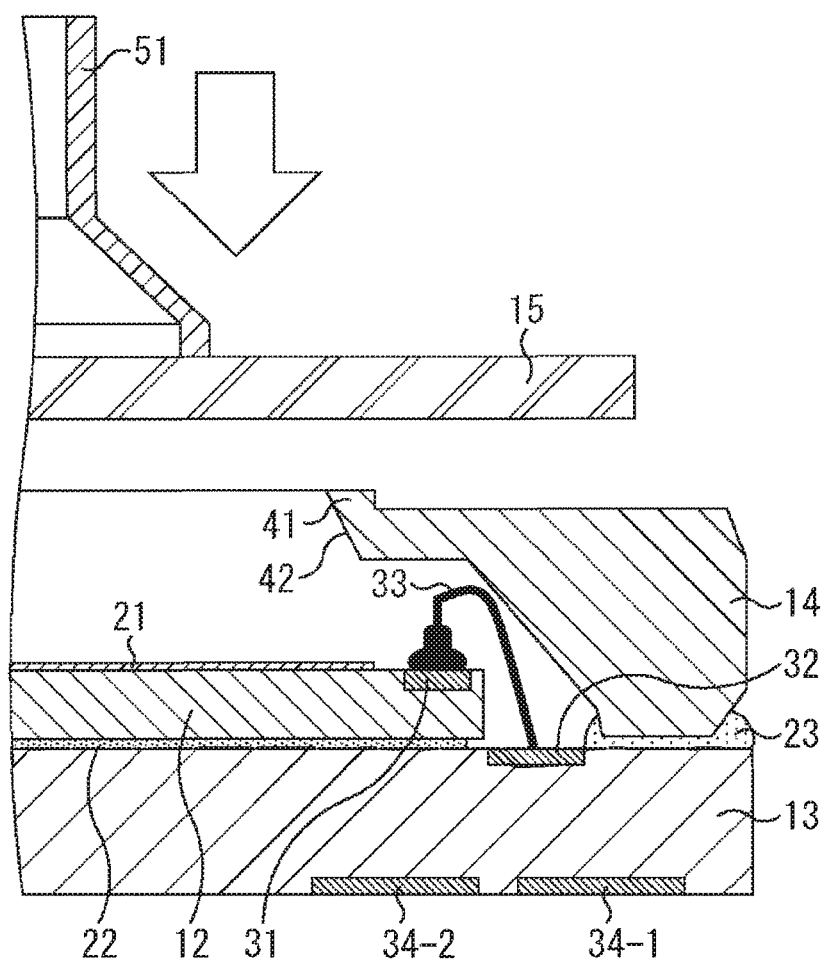
FIG. 3 is a diagram for explaining a first step.

First, as shown in FIG. 3, in a first step, a process of setting the protective glass 15 onto the frame 14 is performed. As shown in the drawing, the imaging device chip 12 is bonded to the interposer substrate 13, the imaging device chip 12 and the interposer substrate 13 are electrically connected by the connection wires 33-1 and 33-2, and the frame 14 is bonded to the interposer substrate 13, so that a semi-finished product is formed.

The protective glass 15 is held above the frame 14 of this semi-finished product by a pickup hand 51. With the protective glass 15 being kept in a position with respective to the frame 14, the pickup hand 51 is lowered, and the protective glass 15 is set onto the frame 14.

Figure 4:
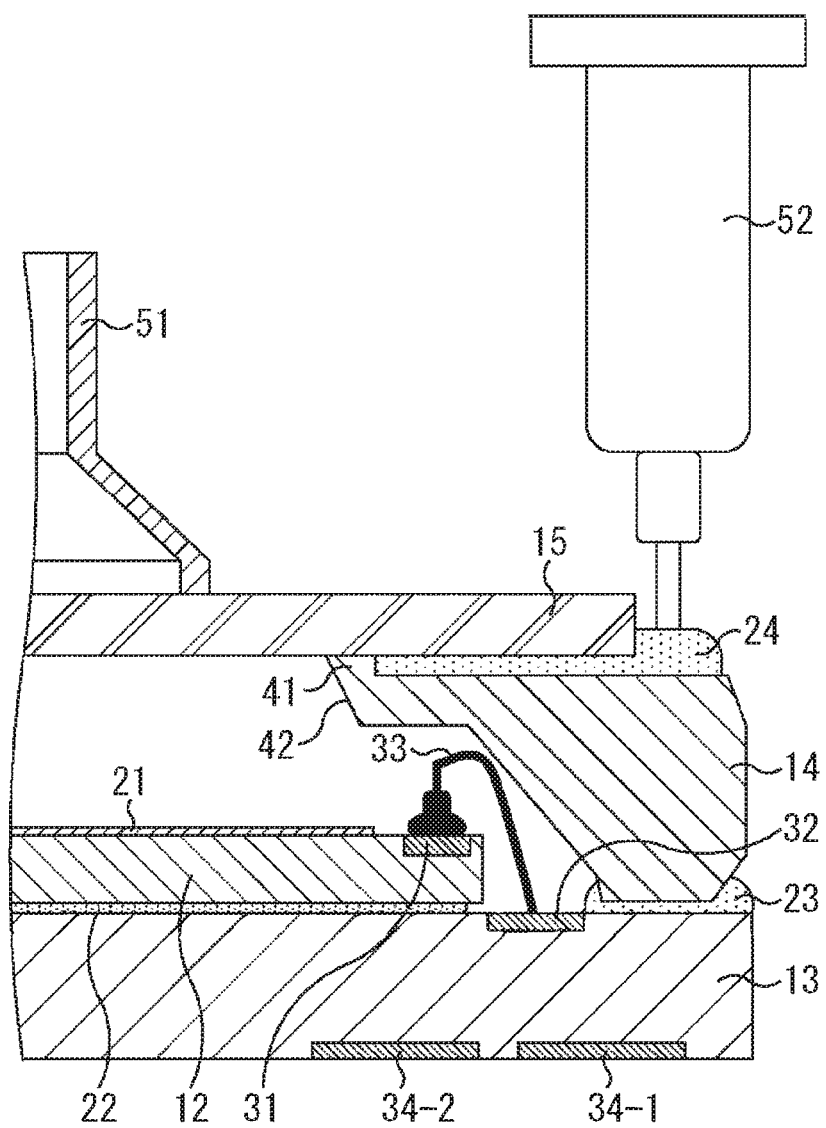
FIG. 4 is a diagram for explaining a second step.

As shown in FIG. 4, in a second step, a process of applying the protective glass adhesive 24 is then performed. As shown in the drawing, the protective glass adhesive 24 is applied from a dispenser 52 to the edge face of the protective glass 15. In this step, the protective glass adhesive 24 enters the gap formed between the protective glass 15 and the frame 14 by the bank structure 41, and manages to stably spread through a capillary action.

Figure 5:
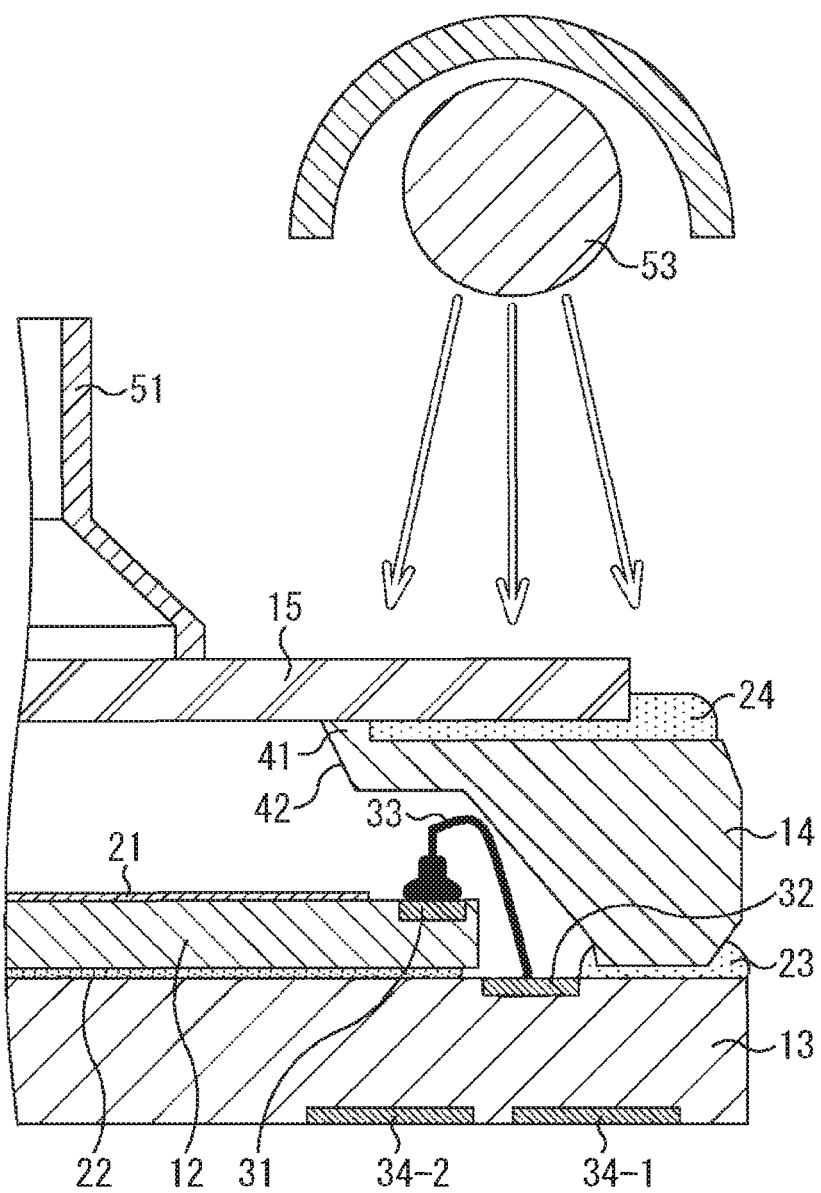
FIG. 5 is a diagram for explaining a third step.

Thereafter, as shown in FIG. 5, in a third step, a process of causing the protective glass adhesive 24 to cure is performed. As shown in the drawing, an UV emission device 53 emits UV light onto the protective glass adhesive 24, to cause the protective glass adhesive 24 to cure, and fix the frame 14 and the protective glass 15 to each other. In this step, while the UV emission is being performed by the UV emission device 53, the protective glass 15 is kept in a position by the pickup hand 51. In this manner, the protective glass 15 can be stably bonded and secured to the frame 14.

Figure 6:
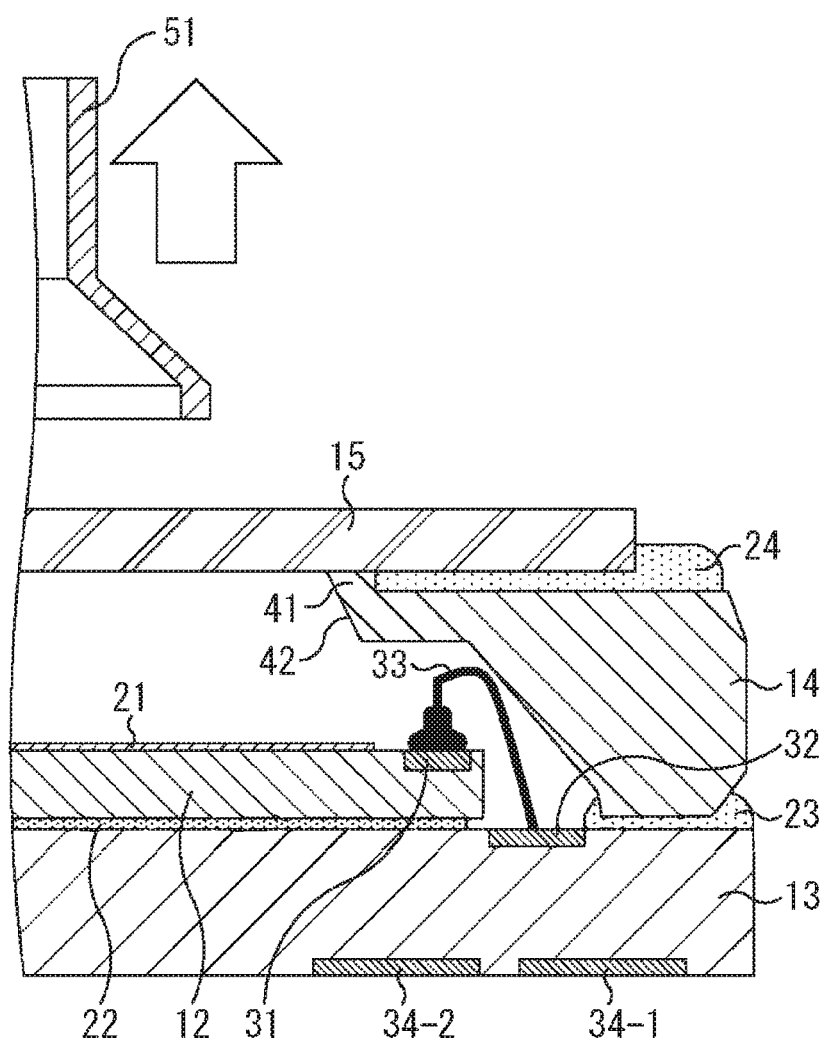
FIG. 6 is a diagram for explaining a fourth step.

Then, as shown in FIG. 6, in a fourth step, the protective glass 15 is released from the pickup hand 51, and the pickup hand 51 is lifted up.

The solid-state imaging device package 11 is manufactured through the above procedures, and the bank structure 41 prevents the protective glass adhesive 24 from entering the inner side of the opening portion of the frame 14. Thus, irregular reflection by the protective glass adhesive 24 can be prevented, and higher-quality images can be captured. Furthermore, size and cost reductions can be achieved.

<Example Configuration of an Electronic Apparatus>

It should be noted that the solid-state imaging device package 11 of the above described embodiment can be used in various kinds of electronic apparatuses, such as imaging systems for digital still cameras and digital video cameras, portable telephone devices having imaging functions, and other apparatuses having imaging functions.

Figure 7:
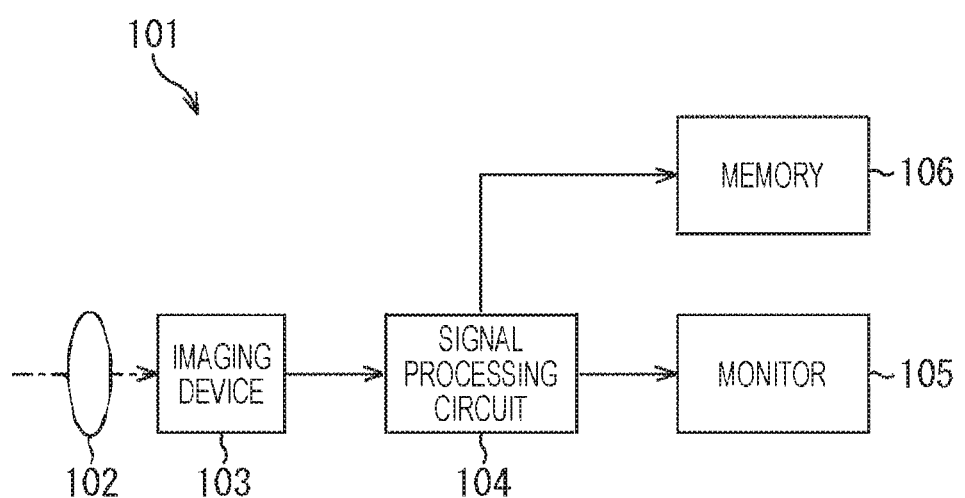
FIG. 7 is a block diagram showing an example configuration of an imaging apparatus installed in an electronic apparatus.

FIG. 7 is a block diagram showing an example configuration of an imaging apparatus mounted in an electronic apparatus.

As shown in FIG. 7, an imaging apparatus 101 includes an optical system 102, an imaging device 103, a signal processing circuit 104, a monitor 105, and a memory 106, and can take still images and moving images.

The optical system 102 includes one or more lenses to guide image light (incident light) from the object to the imaging device 103, and form an image on the light receiving surface (the sensor portion) of the imaging device 103.

The solid-state imaging device package 11 of the above described embodiment is used as the imaging device 103. In the imaging device 103, electrons are accumulated for a certain period of time in accordance with an image to be formed on the light receiving surface via the optical system 102. A signal corresponding to the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106.

In the imaging apparatus 101 having the above described configuration, the solid-state imaging device package 11 of the above embodiment is used, so that higher-quality images can be captured, for example.

<Examples of Use of an Image Sensor>

Figure 8:
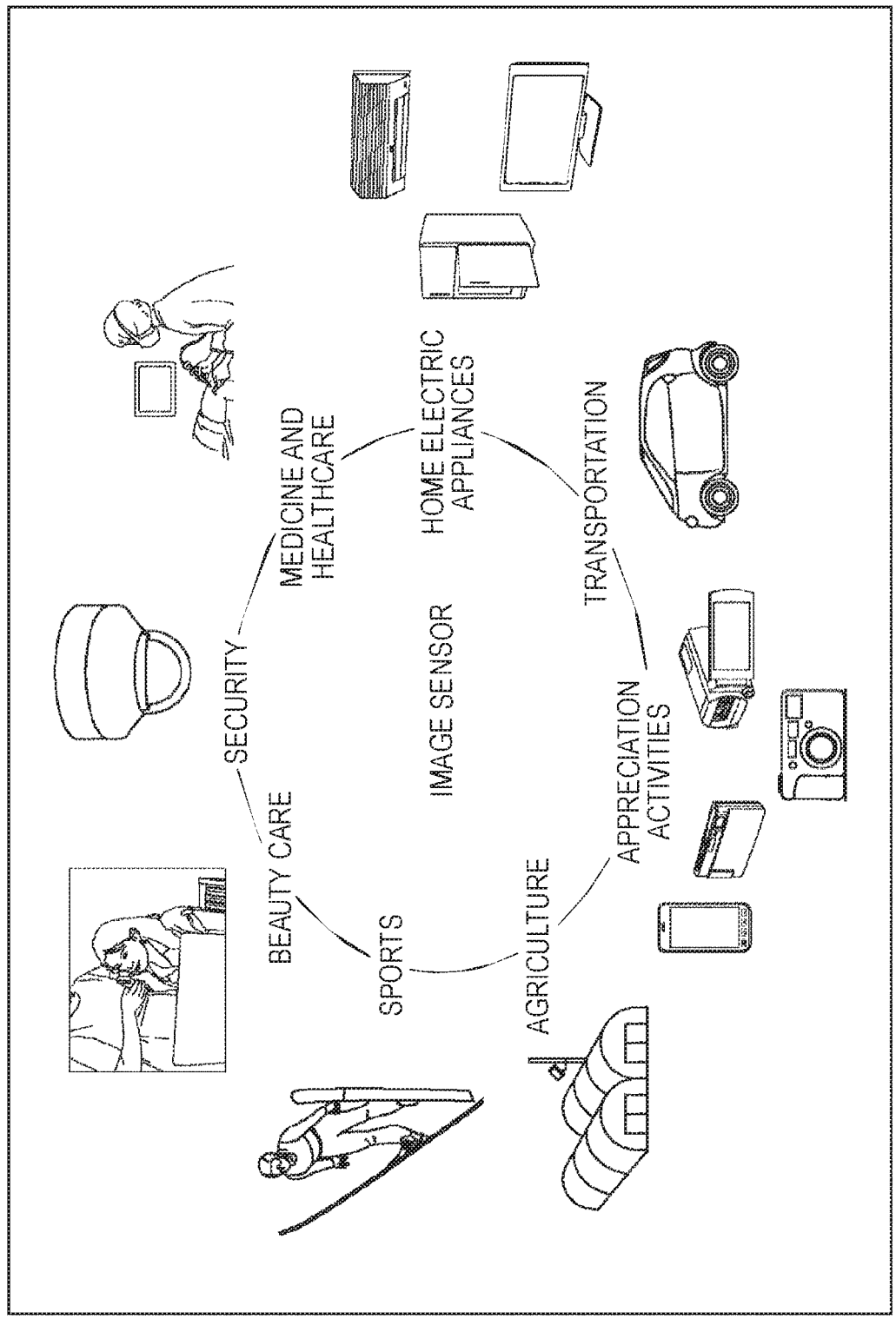
FIG. 8 is a diagram showing examples of use of image sensors.

FIG. 8 is a diagram showing examples of use of the above-described image sensor (the solid-state imaging device package 11).

The above described image sensor can be used in various cases where light such as visible light, infrared light, ultraviolet light, or an X-ray is sensed, as described below.

- Devices configured to take images for appreciation activities, such as digital cameras and portable devices with camera functions.
- Devices for transportation use, such as vehicle-mounted sensors configured to take images of the front, the back, the surroundings, the inside and the like of an automobile to perform safe driving like an automatic stop, recognize a driver's condition and the like, surveillance cameras for monitoring running vehicles and roads, and ranging sensors for measuring distances between vehicles or the like.
- Devices to be used in conjunction with home electric appliances, such as television sets, refrigerators, and air conditioners, to take images of gestures of users and operate the appliances in accordance with the gestures.
- Devices for medical care use and health care use, such as endoscopes and devices for receiving infrared light for angiography.
- Devices for security use, such as surveillance cameras for crime prevention and cameras for personal authentication.
- Devices for beauty care use, such as skin measurement devices configured to image the skin and microscopes for imaging the scalp.
- Devices for sporting use, such as action cameras and wearable cameras for sports.
- Devices for agricultural use such as cameras for monitoring conditions of fields and crops.

It should be noted that the present technology may also be embodied in the configurations described below.

(1)

A solid-state imaging device package including:
a solid-state imaging device chip that converts light taken in by a lens into an electrical signal;
an interposer substrate that secures the solid-state imaging device chip;
a frame having a frame structure that encloses the solid-state imaging device chip and prevents emission of unnecessary light onto a light receiving surface of the solid-state imaging device chip; and
a protective glass that protects at least the solid-state imaging device chip from external environments, and transmits light,
in which a raised bank structure is formed on an adhesion surface of the frame in contact with the protective glass, the raised bank structure being formed along an entire circumference of an opening portion of the frame.

(2)

The solid-state imaging device package of (1), in which the opening portion of the frame is formed so that light at a maximum incident angle taken in from the lens is emitted on an inner side of an electrode of the solid-state imaging device chip.

(3)

The solid-state imaging device package of (1) or (2), in which a surface facing an inner side of the opening portion of the frame is formed with a tapered surface extending from the top to the bottom at a predetermined angle.

(4)

A method of manufacturing a solid-state imaging device package including: a solid-state imaging device chip that converts light taken in by a lens into an electrical signal; an interposer substrate that secures the solid-state imaging device chip; a frame having a frame structure that encloses the solid-state imaging device chip and prevents emission of unnecessary light onto a light receiving surface of the solid-state imaging device chip; a protective glass that protects at least the solid-state imaging device chip from external environments, and transmits light; and a raised bank structure that is formed on an adhesion surface of the frame in contact with the protective glass, the raised bank structure being formed along the entire circumference of an opening portion of the frame,
the method including the step of applying an adhesive in such a manner that the adhesive enters a gap formed between the protective glass and the frame by the bank structure.

(5)

An electronic apparatus including
a solid-state imaging device package including:
a solid-state imaging device chip that converts light taken in by a lens into an electrical signal;
an interposer substrate that secures the solid-state imaging device chip;
a frame having a frame structure that encloses the solid-state imaging device chip and prevents emission of unnecessary light onto a light receiving surface of the solid-state imaging device chip; and
a protective glass that protects at least the solid-state imaging device chip from external environments, and transmits light,
in which a raised bank structure is formed on an adhesion surface of the frame in contact with the protective glass, the raised bank structure being formed along an entire circumference of an opening portion of the frame.

It should be noted that this embodiment is not limited to the above described embodiment, and various modifications may be made to it without departing from the scope of the present disclosure.

REFERENCE SIGNS LIST

11 Solid-state imaging device package
12 Imaging device chip
13 Interposer substrate
14 Frame
15 Protective glass
21 Imaging device light receiving surface
22 Imaging device adhesive
23 Frame adhesive
24 Protective glass adhesive
31 Imaging device electrode
32 Internal electrode
33 Connection wire
34 External connection terminal
41 Bank structure
42 Tapered surface
43 Frame step

The invention claimed is:

1. A solid-state imaging device package, comprising:
a solid-state imaging device chip configured to convert light taken in by a lens into an electrical signal;
an interposer substrate that secures the solid-state imaging device chip;
a protective glass configured to transmit the light; and
a frame, wherein
the frame comprises a frame structure that encloses the solid-state imaging device chip,
the frame structure prevents emission of unnecessary light onto a light receiving surface of the solid-state imaging device chip,
the frame structure comprises a raised bank structure,
the raised bank structure is on an adhesion surface of the frame,
the adhesion surface is in contact with the protective glass,
the raised bank structure is along an entire circumference of an opening portion of the frame, and
the protective glass protects at least the solid-state imaging device chip from external environments.

2. The solid-state imaging device package according to claim 1, wherein light at a maximum incident angle taken in by the lens is emitted on an inner side of an electrode of the solid-state imaging device chip.

3. The solid-state imaging device package according to claim 1, wherein
the frame comprises a tapered surface,
the tapered surface faces an inner side of the opening portion of the frame, and
the tapered surface extends at a specific angle from a top of the raised bank structure.

4. An electronic apparatus, comprising:
a solid-state imaging device package that comprises:
a solid-state imaging device chip configured to convert light taken in by a lens into an electrical signal;
an interposer substrate that secures the solid-state imaging device chip;
a protective glass configured to transmit the light; and
a frame, wherein
the frame comprises a frame structure that encloses the solid-state imaging device chip, the frame structure prevents emission of unnecessary light onto a light receiving surface of the solid-state imaging device chip,
the frame structure comprises a raised bank structure,
the raised bank structure is on an adhesion surface of the frame,
the adhesion surface is in contact with the protective glass,
the raised bank structure is along an entire circumference of an opening portion of the frame, and
the protective glass protects at least the solid-state imaging device chip from external environments.

* * * * *